US012741865B2

(12) United States Patent
Xia

(10) Patent No.: US 12,741,865 B2
(45) Date of Patent: Sep. 22, 2026

(54) METHOD OF FABRICATING MICRO-ELECTROMECHANICAL SYSTEM DEVICE

(71) Applicant: Vanguard International Semiconductor Corporation, Hsinchu (TW)

(72) Inventor: Jia Jie Xia, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 41 days.

(21) Appl. No.: 18/537,807

(22) Filed: Dec. 13, 2023

(65) Prior Publication Data

US 2024/0116749 A1 Apr. 11, 2024

Related U.S. Application Data

(62) Division of application No. 16/937,552, filed on Jul. 23, 2020, now Pat. No. 11,878,905.

(51) Int. Cl.
*B81C 1/00* (2006.01)
*B81B 3/00* (2006.01)
*G01P 15/08* (2006.01)

(52) U.S. Cl.
CPC ........ *B81C 1/00182* (2013.01); *B81B 3/0021* (2013.01); *G01P 15/08* (2013.01); *B81C 2203/03* (2013.01); *G01P 2015/0817* (2013.01)

(58) Field of Classification Search
CPC ........... B81B 3/0021; B81B 2201/0235; G01P 15/08; G01P 2015/0817; G01P 15/0802; G01P 15/097; B81C 2203/03; B81C 1/00182; H04R 31/00; H04R 2201/003; H04R 2201/107; H04R 17/02
See application file for complete search history.

(56) References Cited

U.S. PATENT DOCUMENTS 7,849,745 B2 12/2010 Wang et al.
9,550,668 B1 1/2017 Xia
2007/0024395 A1 2/2007 Motai
2010/0285628 A1* 11/2010 Martin ..................... H04R 3/00 257/E21.002

(Continued)

FOREIGN PATENT DOCUMENTS

CN 110636421 A 12/2019

OTHER PUBLICATIONS

Zou, "highly symmetric tri-axis piezoelectric bimorph accelerometer", 2004.

*Primary Examiner* — Steven B Gauthier
*Assistant Examiner* — Sun Mi Kim King
(74) *Attorney, Agent, or Firm* — Winston Hsu

(57) ABSTRACT

The present disclosure related to a micro-electromechanical system (MEMS) device and a method of forming the same. The MEMS device includes a substrate, a cavity, an interconnection structure and a proof mass. The substrate includes a first surface and a second surface opposite to the first surface. The cavity is disposed in the substrate to extend between the first surface and the second surface. The interconnection structure is disposed on the first surface of the substrate, over the cavity. The proof mass is disposed on the interconnection structure, wherein the proof mass is partially suspended over the interconnection structure.

7 Claims, 8 Drawing Sheets

(56) References Cited

U.S. PATENT DOCUMENTS

| | | | |
|---|---|---|---|
| 2011/0126632 | A1 | 6/2011 | McNeil |
| 2013/0152688 | A1 | 6/2013 | Sun |
| 2017/0115322 | A1 | 4/2017 | Li |

* cited by examiner

METHOD OF FABRICATING MICRO-ELECTROMECHANICAL SYSTEM DEVICE

CROSS REFERENCE TO RELATED APPLICATIONS

This application is a division of U.S. application Ser. No. 16/937,552, filed on Jul. 23, 2020. The content of the application is incorporated herein by reference.

BACKGROUND OF THE INVENTION

1. Field of the Invention

The present disclosure relates to a micro-electromechanical system (MEMS) device and a method of forming the same, and more particularly, to a MEMS device for acoustic application and a method of forming the same.

2. Description of the Prior Art

A micro-electromechanical system (MEMS) device is a microscopic device that is fabricated through general semiconductor processes, such as depositing or selective etching material layers. The microscopic devices include both the electronic and mechanical function which is operated based on, for instance, electromagnetic, electrostrictive, thermoelectric, piezoelectric, or piezoresistive effects. Therefore, MEMS structures are often applied to microelectronics such as accelerometer, gyroscope, mirror, and acoustic sensor, etc.

Recently, MEMS accelerometer products bring a new dimension to acoustic transducers, due to the fast development of true wireless stereo (TWS) earphone, and which is used for sensing the vibration of voices. The MEMS accelerometer products deployed in TWS earphones allows the TWS earphones to attractively pick-up voice even when there is high noise or wind noise in the surrounding environment. However, currently design of MEMS accelerometer product is mainly thick and large, so as to be applied on mobile phone generally, which could not meet the minimized requirement of the TWS earphones. Thus, a new accelerometer design is needed for acoustic application.

SUMMARY OF THE INVENTION

The present disclosure provides a micro-electromechanical system (MEMS) device and a method of forming the same, in which the proof mass is partially suspended over the interconnection structure. Thus, the disposing position of the proof mass will not cause impacting stiffness to the interconnection structure, so that, the size, the mass and the thickness of the proof mass in the present disclosure may be sufficiently enlarged so as to gain improved sensor accuracy.

An embodiment of the present disclosure provides a MEMS device including a substrate, a cavity, an interconnection structure and a proof mass. The substrate includes a first surface and a second surface opposite to the first surface. The cavity is disposed in the substrate to extend between the first surface and the second surface. The interconnection structure is disposed on the first surface of the substrate, over the cavity. The proof mass is disposed on the interconnection structure, wherein the proof mass is partially suspended over the interconnection structure.

An embodiment of the present disclosure provides a method of forming MEMS device including the following steps. Firstly, a substrate is provided, and the substrate includes a first surface and a second surface opposite to the first surface. Next, a cavity extending between the first surface and the second surface is formed on the substrate, and an interconnection structure is formed on the first surface of the substrate. Then, a proof mass is formed on the interconnection structure, wherein the proof mass is partially suspended over the interconnection structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
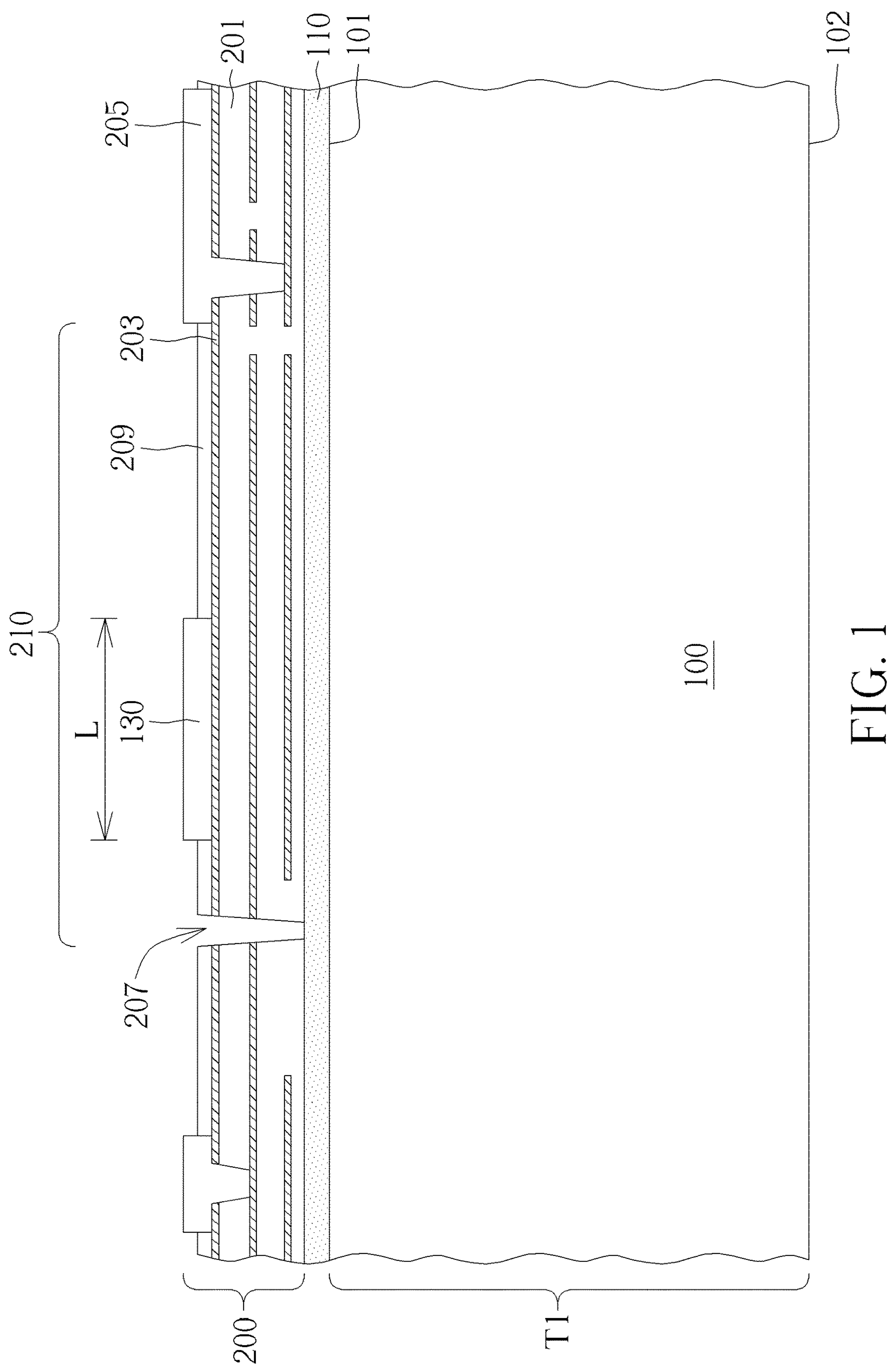
FIG. 1 is a schematic diagram illustrating a cross-sectional view of a MEMS device after forming proof mass.

For better understanding of the presented disclosure, preferred embodiments will be described in detail. The preferred embodiments of the present disclosure are illustrated in the accompanying drawings with numbered elements.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Figure 2:
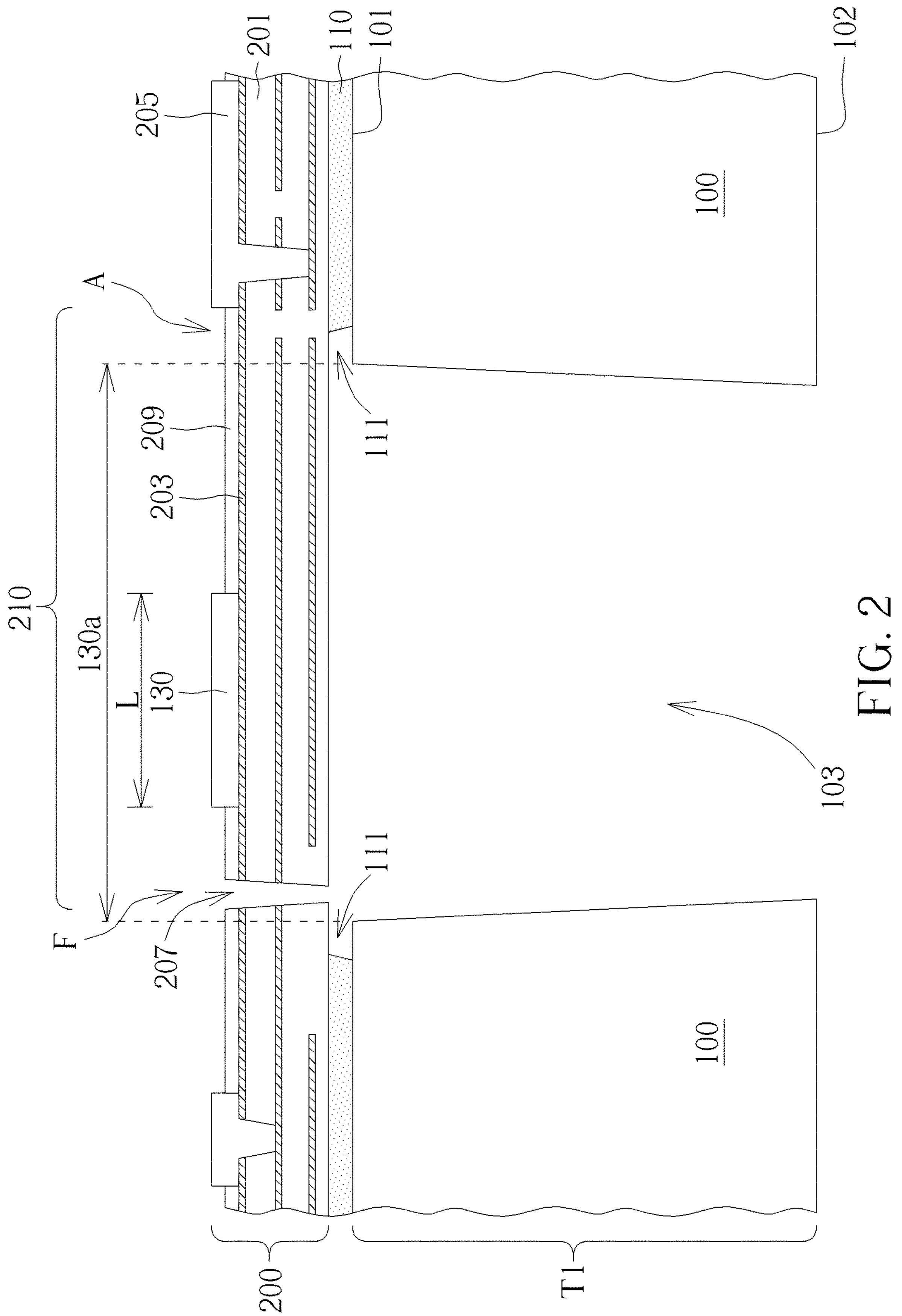
FIG. 2 is a schematic diagram illustrating a cross-sectional view of a MEMS device after forming cavity.
Figure 3:
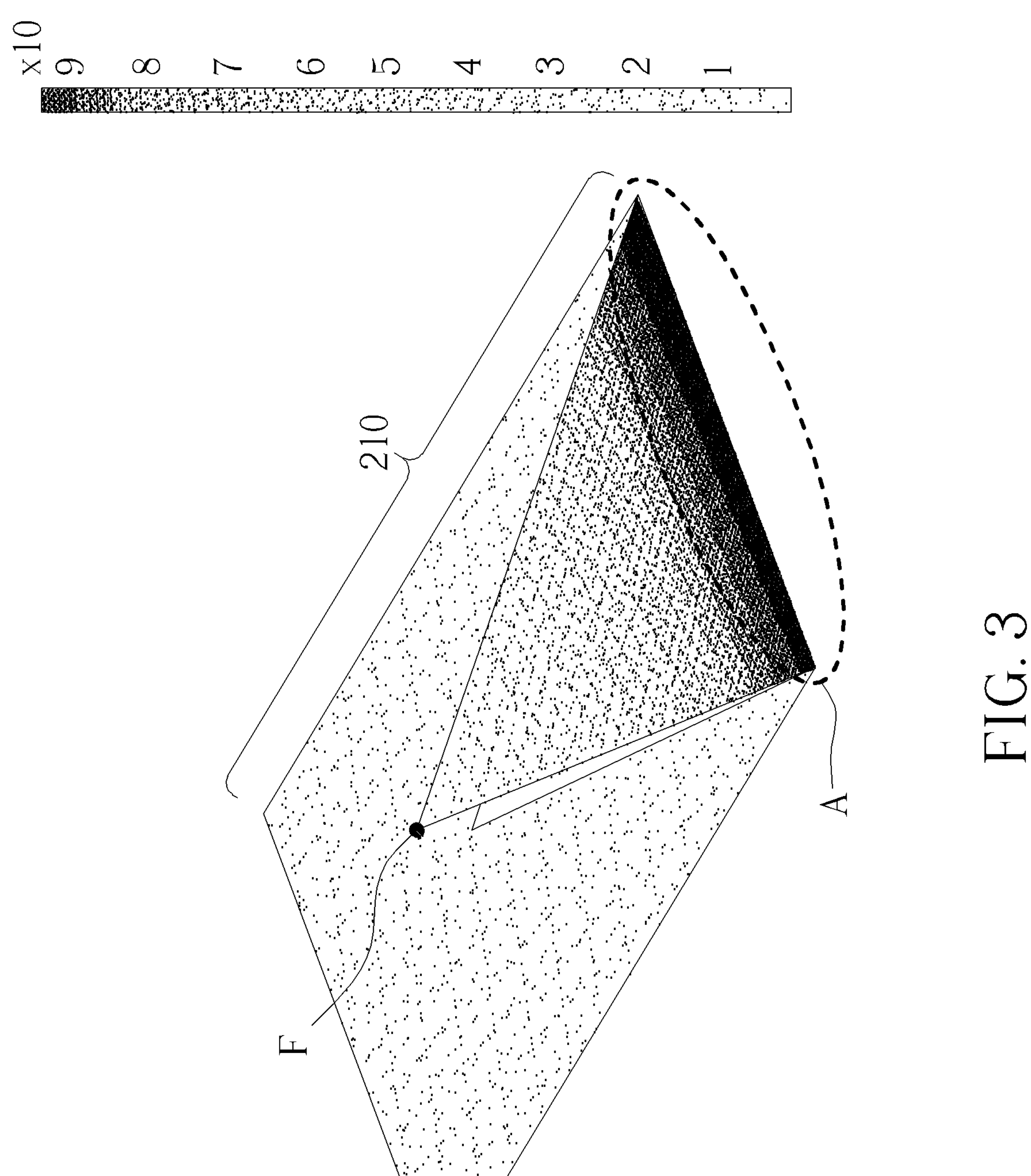
FIG. 3 is a schematic diagram illustrating a stress distribution model of suspended region.

Please refer to FIG. 1 to FIG. 3, which illustrate a fabricating process of a MEMS device according to a first embodiment of the present disclosure. Firstly, as shown in FIG. 1, a substrate 100 such as a bulk silicon substrate is provided, and the substrate 100 for example includes single-crystalline silicon, polysilicon, amorphous silicon, or other suitable material, but not limited thereto. The substrate 100 includes a suitable thickness T1 such as being about 400-500 micrometers (μm), but not limited thereto. People who has ordinary skill in the art should easily realized that, the thickness of the substrate 100 may be further adjustable according to a predetermined depth of cavity formed subsequently, so as to meet practical product requirements.

The substrate 100 has two surfaces opposite to each other, such as a first surface 101 and a second surface 102 as shown in FIG. 1, and an oxide layer 110 and an interconnection structure 200 are sequentially formed on the first surface 101 of the substrate 100. The oxide layer 110 for example include silicon oxide (SiO) or silicon dioxide ($SiO_2$), and the interconnection structure 200 may be any suitable semiconductor device being formed through general semiconductor processes such as depositing and/or selectivity etching material layers. The interconnection structure 200 may include at least a bottom electrode (not shown in the drawings), a top electrode (not shown in the drawings) disposed over the bottom electrode, and a piezoelectric layer (not shown in the drawings) disposed between the bottom electrode and the top electrode. In one embodiment, the interconnection structure 200 includes at least one dielectric layer 201 (for example including a dielectric material like silicon nitride or silicon oxynitride) stacked on the surface 101, at least one metal layer 203 (for example including a metal material like copper, molybdenum, tungsten or aluminum) embedded in the at least one dielectric layer, and at least one conductive pad 205 electrically connected to the at least one metal layer 203, as shown in FIG. 1, but not limited thereto.

It is noted that the interconnection structure 200 further includes a penetrating hole 207 within a suspended region 210, so that, structure within the suspended region 210 may be partially disconnected with the substrate 100 in the subsequent process to form a suspended structure (not shown in the drawings). The suspended structure for example include the top electrode, the piezoelectric layer and the bottom electrode stacked from top to bottom in the interconnection structure 200, which is capable of vibrating at a certain frequency during the operation of the MEMS device. In the present embodiment, the suspended structure may include a cantilever, a diaphragm or the like, but not limited thereto.

Next, a proof mass 130 is formed on the interconnection structure 200, over the suspended structure within the suspended region 210. The proof mass 130 includes any suitable material with higher mass density, such as aluminum copper (AlCu), copper (Cu), gold (Au), platinum (Pt), molybdenum (Mo) or silicon (Si), but not limited thereto. Preferably, the proof mass 130 is disposed adjacent to the penetrating hole 207, and a length "L" of the proof mass 130 is for example about ½-⅓ of a length of the suspended region 210, so as to avoid being disposed on a stress concentrated area of the interconnection structure 200. In addition, a thickness of the proof mass 130 is preferably about 1-3 μm. In one embodiment, the proof mass 130 is formed in a top dielectric layer 209 of the interconnection structure 200, for example, being partially protruded from a top surface of the top dielectric layer 209 as shown in FIG. 1 to gain more mass, but not limited thereto. In another embodiment, a proof mass (not shown in the drawing) may also be formed to be coplanar with the top surface of the top dielectric layer 209.

Then, as shown in FIG. 2, a cavity 103 is formed in the substrate 100 from a backside, namely the side of the second surface 102. Precisely, a mask layer (not shown in the drawing) is firstly formed on the second surface 102 to define the position and the dimension of the cavity 103, and an etching process such as an anisotropic dry etching process is performed on the backside of the substrate 100 through the mask, to remove a certain amount of the substrate 100 till exposing the oxide layer 110 underneath. The opening of the mask layer is preferably corresponding to the suspended structure within the suspended region 210, and a dimension thereof is preferably the same as a predetermined diameter of the cavity 103, such as about 100-150 μm, but not limited to. One of ordinary skill in the art would fully understand that, the dimension of the cavity 103 may also be adjustable according to different product requirements.

In other words, the cavity 103 is formed by using the oxide layer 110 as an etching stop layer, and the cavity 103 is extended between two surfaces (the first surface 101 and the second surface 102) of the substrate 100, thereby corresponding to the suspended structure within the suspended region 210 of the interconnection structure 200 on the first surface 101. According, a depth of the cavity 103 may be the same as the thickness T1 of the substrate 100, and the cavity 103 includes an opening **103*a* adjacent to a bottom surface of the suspended region 210 as shown in FIG. 2. After that, another etching process is performed to remove the exposed portion of the oxide layer 110, so that the bottom surface of the suspended region 210 of the interconnection structure 200 may be exposed and in connection with the cavity 103 underneath, as shown in FIG. 2. It is noted that, during the process of performing the another etching process, sidewalls of the oxide layer 110 may be also slightly removed to form an undercut portion 111 adjacent to the edge of the opening 103*a* of the cavity 103**.

In addition, in one embodiment, a protection layer (not shown in the drawing) is further formed on the interconnection structure 200 before forming the cavity 103, in order to protect the elements disposed in the interconnection structure 200, and the protection layer for example includes silicon oxide or silicon dioxide. Then, after forming the cavity 103 and removing the exposed portion of the oxide layer 110, the protection layer is completely removed to release the suspended structure within the suspended region 210 of the interconnection structure 200. Thus, one end (also known as a free end "F") of the suspended structure within the suspended region 210 may be disconnected with the substrate 100 due to the existence of the penetrating hole 207, and another end (also known as an anchor end "A") of the suspended structure within the suspended region 210 may be still in connection with the substrate 100 as well as the remained oxide layer 110 disposed on the substrate 110, as shown in FIG. 2.

Through above processes, a MEMS device according to the first embodiment of the present disclosure is accomplished. In the present embodiment, the MEMS device includes the suspended structure disposed within the suspended region 210 of the interconnection structure 200, the cavity 103 and the proof mass 130, so as to be configured as a MEMS piezoelectric accelerometer device, with the piezoelectric layer within the suspended structure capable of vibrating when applying acoustic waves or electrical signals, and with the proof mass 130 capable of adjusting the mass of suspended structure to have a resonant frequency that matches the required acoustic frequency range. It is noted that, while the suspended structure is vibrating, the pressure, as well as the vibration, may deform the suspended structure which in turn cause the suspended structure to generate piezoelectricity. Generally, relatively more stresses are concentrated at the anchor end "A" of the suspended structure within the suspended region 210, as reference to a stress distribution mode shown FIG. 3, in which, the strength of stress distributed within the suspended region 210 is illustrated by the density of dot. Thus, it is noteworthy that the proof mass 130 of the present embodiment is namely disposed adjacent to the free end "F" of the suspended structure within the suspended region 210, which is namely an area with less stress distribution. In this way, the existence of the proof mass 130 in the present embodiment will not lead to impacting stiffness to the suspended structure within the suspended region 210. Furthermore, the mass of proof mass 130 is positively related to a minimum detectable signal of the MEMS device due to the formula (I) below, so that, the MEMS device with said proof mass 130 in the present disclosure enables to be applied on TWS earphones, for supplying the voice vibration of microphones.

$$a_{min} = \frac{\sqrt{4\kappa_B T\omega_0}}{m_i Q} \tag{I}$$

where amin being minimum detectable signal; κB being Boltzmann's constant; T being absolute temperature; ω0 being resonance frequency; mi being sensor mass; and Q being quality factor.

People skilled in the arts should easily realize the MEMS device and the fabricating process thereof in the present disclosure is not limited to the aforementioned embodiment, and may further include other examples or variations. For example, although the aforementioned fabricating process of the MEMS device is exemplified by being performed on a bulk silicon substrate, the present disclosure is not limited thereto and which may also be performed on a silicon-on-insulator substrate. The following description will detail the different embodiments of the MEMS device and the fabricating process thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

According to another embodiment of the present disclosure, a MEMS device and a fabricating process thereof are disclosed to further provide a proof mass having heavy weight without causing impacting stiffness to the suspended structure, as the minimum detectable signal of the MEMS device is positively related to the mass of proof mass, and the mass of proof mass is further related to the stiffness of the suspended structure within the suspended region. Please refer to FIG. 4 to FIG. 7, which illustrate a fabricating process of a MEMS device according to a second embodiment of the present disclosure. The formal steps of the fabricating process in the present embodiment are substantially similar to those in the aforementioned first embodiment, and the similarity between the present embodiment and the aforementioned embodiment will not be redundant described hereinafter. The difference between the present embodiment and the aforementioned embodiment is mainly in that a proof mass 330 of the present embodiment is partially suspended over the interconnection structure 200.

Figure 4:
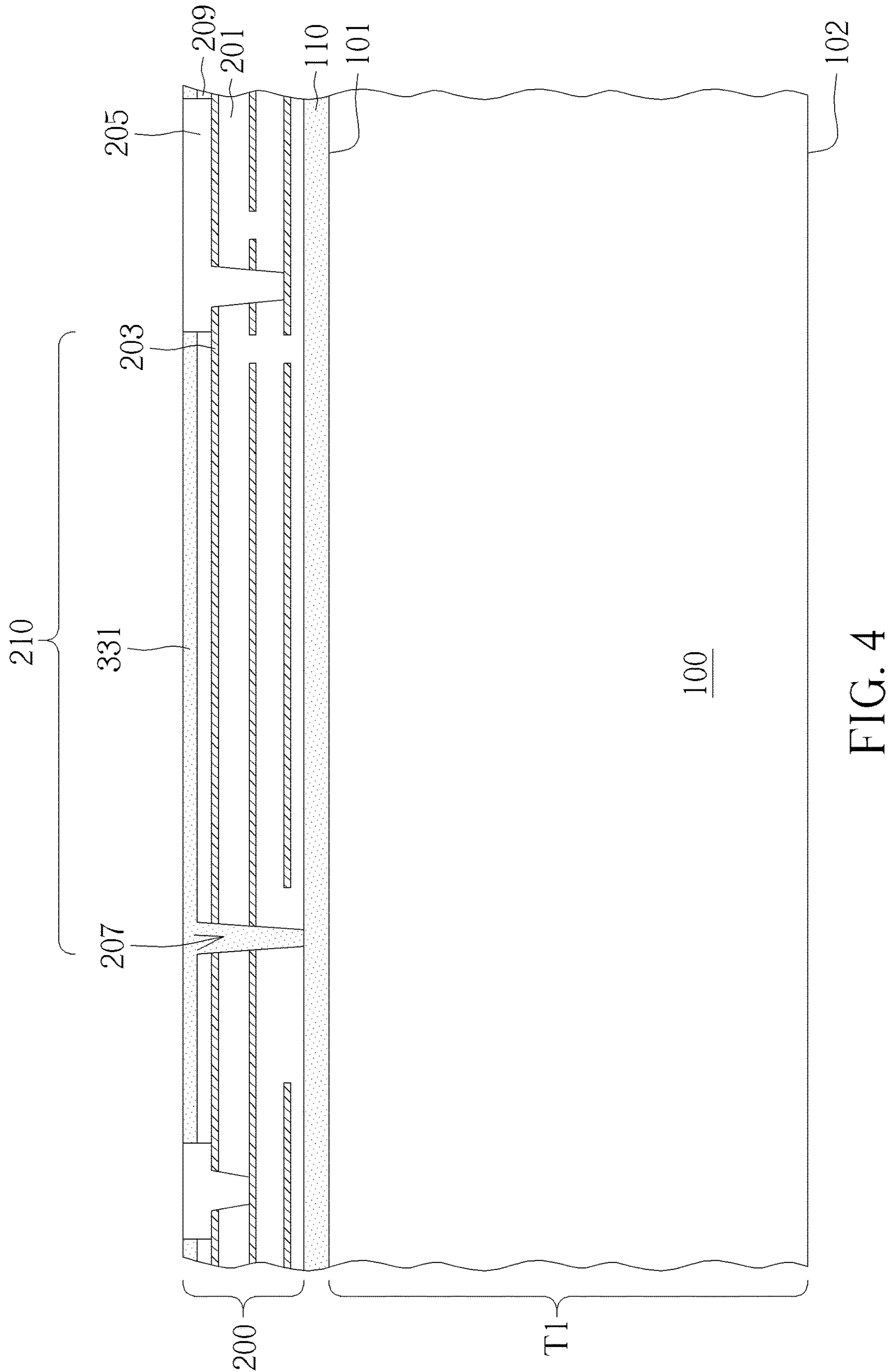
FIG. 4 is a schematic diagram illustrating a cross-sectional view of a MEMS device after forming interconnection structure.

As shown in FIG. 4, the substrate 100 is also provided to have the first surface 101 and the second surface 102, and the oxide layer 110 and the interconnection structure 200 are sequentially formed on the first surface 101. It is noted that, detailed features of the substrate 100, the oxide layer 110 and the interconnection structure 200 of the present embodiment are all substantially the same as those mentioned in the aforementioned first embodiment, and will not be redundantly described hereinafter. In addition, a base material layer 331 is formed on the top surface of the top dielectric layer 209, to further fill in the penetrating hole 207 as shown in FIG. 4. In one embodiment, the base material layer 331 for example includes silicon oxide or silicon dioxide, but not limited thereto.

Figure 5:
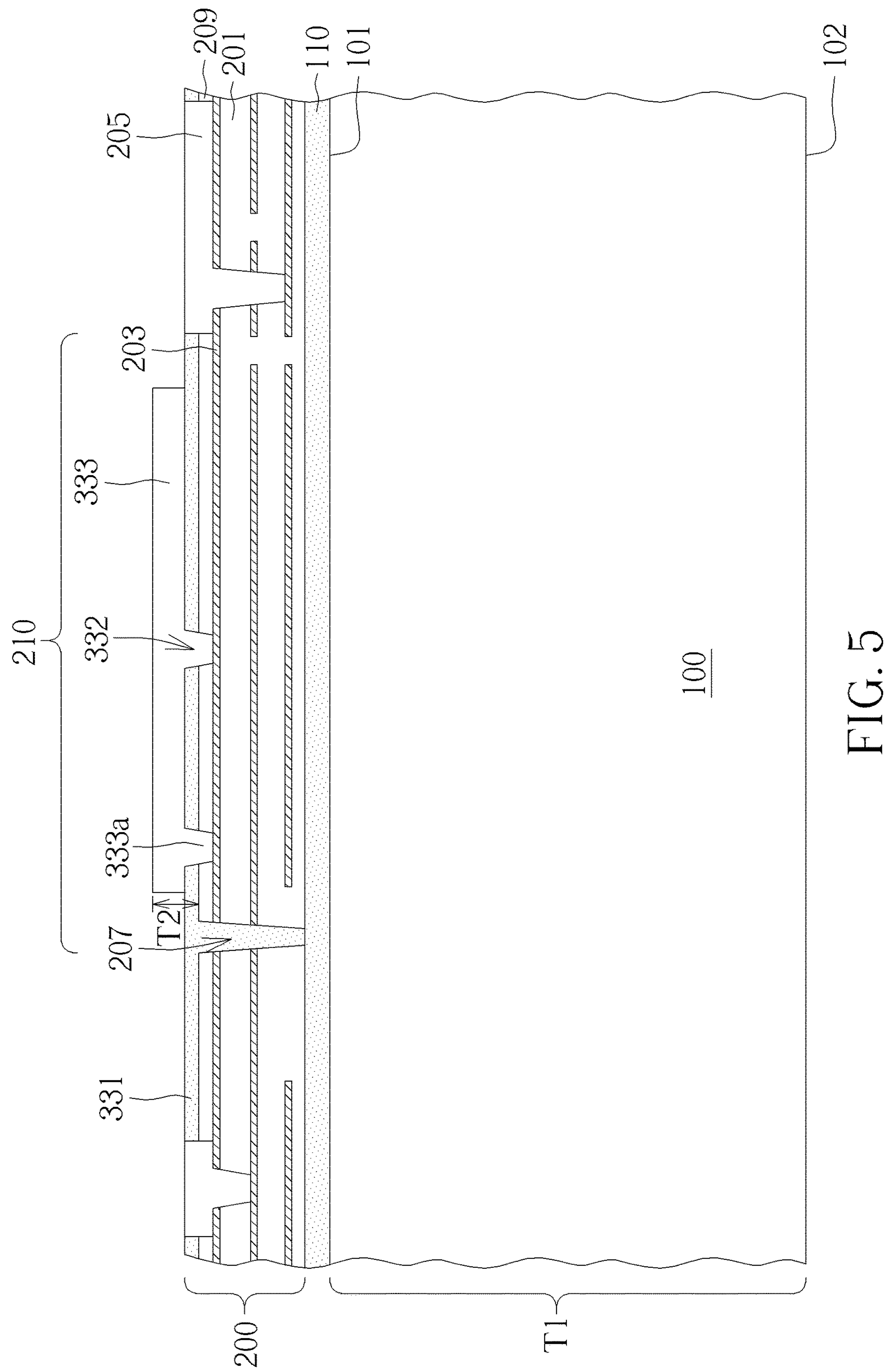
FIG. 5 is a schematic diagram illustrating a cross-sectional view of a MEMS device after forming mass layer.

Next, as shown in FIG. 5, at least one hole is formed in the base material layer 331 and the top dielectric layer 209, within the suspended region 210. Preferably, the at least one hole is formed over the suspended structure where is closed to the penetrating hole 207. In the present embodiment, a hole with a circular shape in a top view (not shown in the drawings) is formed, so that, two separated holes 332 are shown in a cross-sectional view as shown in FIG. 5, but not limited thereto. That is to say, the two separated holes 332 may be connected with each other when the holes 332 are viewed from a top down perspective. In another embodiment, various numbers of holes may also be formed adjacent to the penetrating hole 207 based on practical requirements. Then, a mass layer 333 is formed on the base material layer 331, within the suspended region 210, wherein a portion of the mass layer 333 further fill in the holes 332 to form a protrusion 333*a* which surrounds a portion of the base material layer 331, as shown in FIG. 5. The formation of the mass layer 333 may be carried out by firstly forming a mass material layer (not shown in the drawings) on the base material layer 331, with the mass material layer covering the entire surface of the base material layer 331, and patterning the mass material layer to form the mass layer 333 as shown in FIG. 5. In one embodiment the mass layer 333 includes any suitable material with higher mass density, such as aluminum copper, copper, gold, platinum, molybdenum or silicon, but not limited thereto. It is noted that, the mass layer 333 includes a relative greater thickness, so that, an entire thickness T2 of the mass layer 333 and the base material layer 331 underneath may be about 5-15 μm, preferably being about 10 μm, but not limited thereto. Besides, the thickness T2 of the mass layer 333 may be adjusted independent of the thicknesses of adjacent conductive pads disposed on the surface of the interconnection structure 200.

Figure 6:
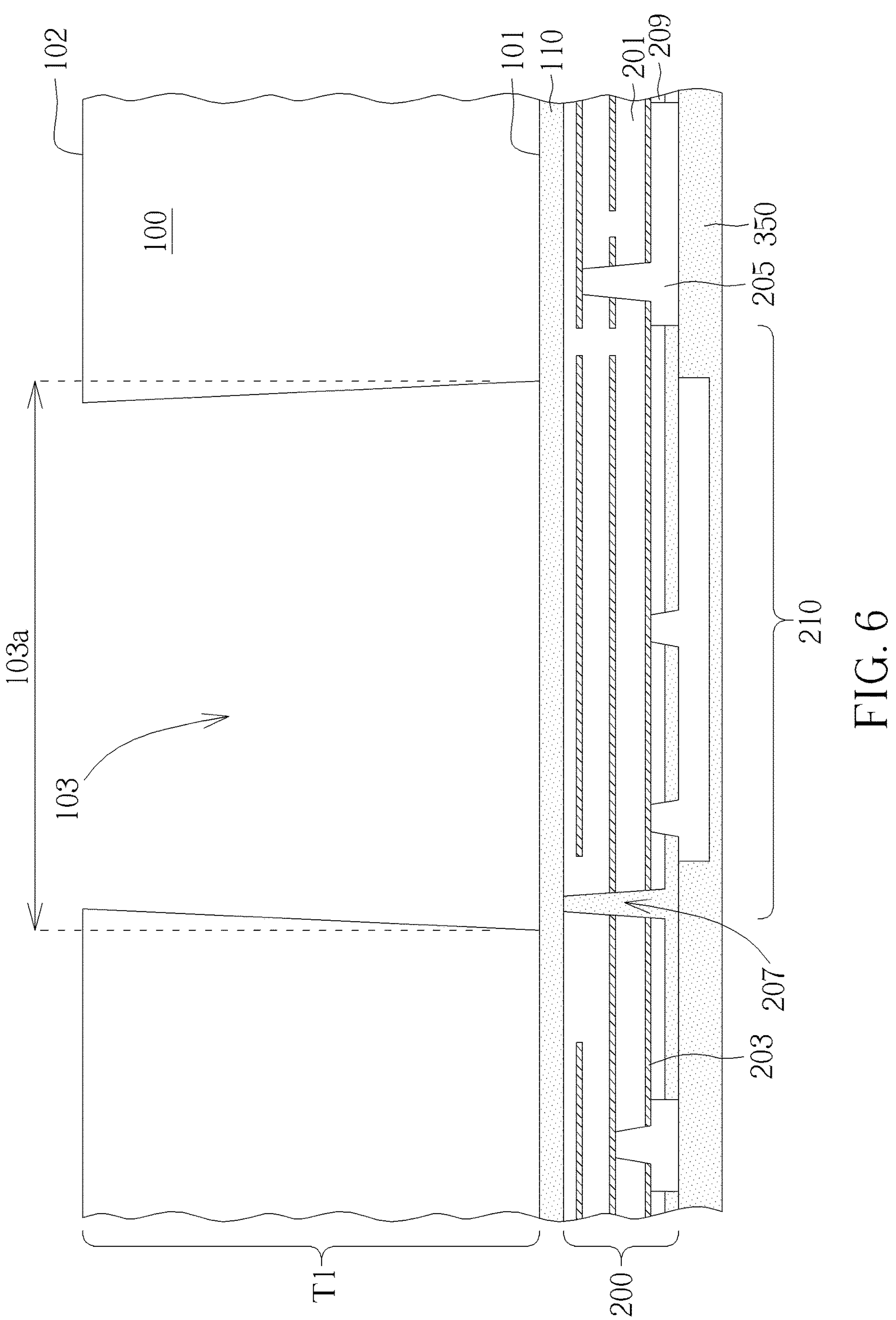
FIG. 6 is a schematic diagram illustrating a cross-sectional view of a MEMS device after forming cavity.

As shown in FIG. 6, a cavity 103 is then formed in the substrate 100 from a backside, namely the side of the second surface 102. Precisely, before forming the cavity 103, a protection layer 350 is formed on the interconnection structure 200 to cover the mass layer 333, the base material layer 331 and the interconnection structure 200 for protecting the elements disposed underneath. The protection layer 350 for example including silicon oxide, silicon dioxide or other materials with the same or similar etching selectivity related to the base material layer 331 underneath. Then, a mask layer (not shown in the drawing) may be formed on the second surface 102 to define the position and the dimension of the cavity 103, and an etching process such as an anisotropic dry etching process is performed on the backside of the substrate 100 through the mask, to remove a certain amount of the substrate 100 till partially exposing the oxide layer 110 underneath. In one embodiment, the opening of the mask layer is corresponding to the suspended structure within the suspended region 210, and a dimension thereof is preferably the same as a predetermined diameter of the cavity 103, for example being about 100-150 μm, but not limited to.

Accordingly, the cavity 103 is formed in the substrate 100 by using the oxide layer 110 as an etching stop layer, with the cavity 103 being extended between two surfaces (the first surface 101 and the second surface 102) of the substrate 100 to have a depth the same as the thickness T1 of the substrate 100. Also, the cavity 103 is corresponding to the suspended structure within the suspended region 210 of the interconnection structure 200 on the first surface 101, and the cavity 103 includes an opening 103*a* adjacent to a bottom surface of the suspended region 210 as shown in FIG. 6.

Figure 7:
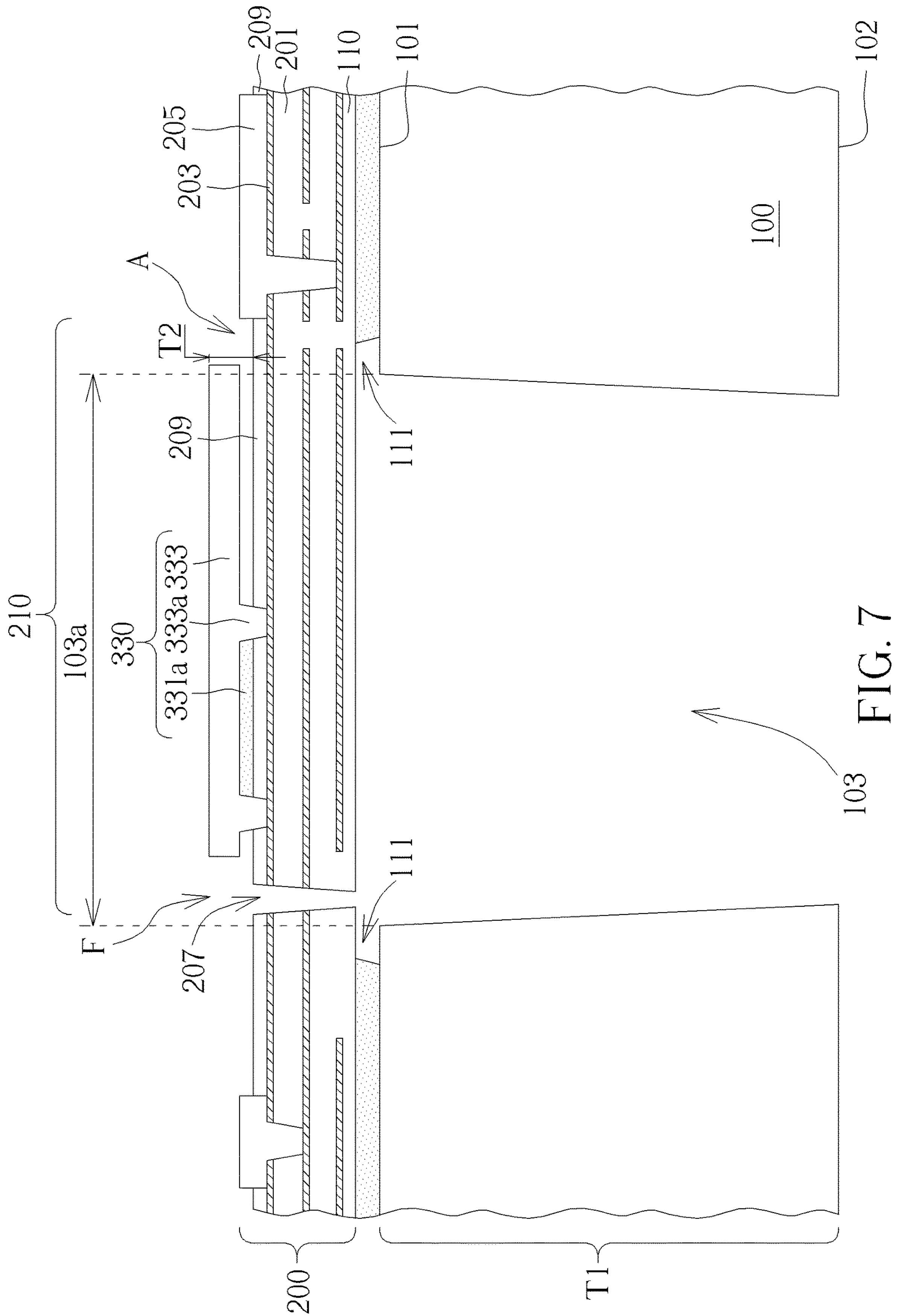
FIG. 7 is a schematic diagram illustrating a cross-sectional view of a MEMS device after forming proof mass.

Following these, as shown in FIG. 7, another etching process, such as an isotropic wet etching process, is performed to remove portions of the oxide layer 110 exposed from the cavity 103, so that the bottom surface of the suspended region 210 of the interconnection structure 200 may be partially exposed thereby to be further in connection with the cavity 103 underneath. Also, during the process of performing the another etching process, sidewalls of the remained oxide layer 110 may be removed to form an undercut portion 111 adjacent to sidewalls of the opening 103*a* of the cavity 103. Then, the protection layer 350 and the base material layer 331 are removed to release the suspended structure within the suspended region 210 of the interconnection structure 200. In this way, one end (also known as a free end "F") of the suspended structure within the suspended region 210 is disconnected with the substrate 100, and another end (also known as an anchor end "A") of the suspended structure within the suspended region 210 is still in connection with the substrate 100, with more stress being concentrated at the anchor end "A" of the suspended structure and with less stress being concentrated at the free end "F" when the suspended structure is vibrating during the operation of the MEMS device.

In one embodiment, the protection layer 350 and the base material layer 331 may be removed also through the same process of removing the exposed oxide layer 110, but not limited thereto. In another embodiment, the protection layer 350 and the base material layer 331 may be removed through another isotropic wet etching process. It is noted that, while removing the protection layer 350 and the base material layer 331, whole protection layer 350 and most of the base material layer 331 are removed to remain a portion of the base material layer 331 which is surrounded by the protrusion 333*a* of the mass layer 333, thereby forming abase layer 331*a* as shown in FIG. 7. Accordingly, base layer 331*a* and the mass layer 333 may together form a proof mass 330 of the present embodiment. The proof mass 330 of the present embodiment includes a double-layered structure, in which the base layer 331*a* and the protrusion 333*a* surrounding the base layer 331*a* both disposed at the bottom refer to a bottom layer of the double-layered structure, and the mass layer 331 disposed on the base layer 331*a* and the protrusion 333*a* refers to a top layer of the double-layered structure. It is also noted that only the bottom layer of the proof mass 330 is directly disposed on the suspended structure within the suspended region 210, close to the free end "F", and the top layer of the proof mass 330 is extended from the free end "F" to the anchor end "A" and one end of the top layer is suspended over the anchor end "A", as shown in FIG. 7.

Through above processes, a MEMS device according to the second embodiment of the present disclosure is accomplished. In the present embodiment, the MEMS device includes the suspended structure disposed within the suspended region 210 of the interconnection structure 200, the cavity 103 and the proof mass 330, also to configured as a MEMS piezoelectric accelerometer device, with the piezoelectric layer within the suspended structure capable of vibrating when applying sound waves or electrical signals, and with the proof mass 330 capable of adjusting the suspended structure to have a resonant frequency that matches the frequency of sound at a selected location. It is noteworthy that the proof mass 330 of the present embodiment includes the double-layered structure having the bottom layer (the base layer 331*a* and the protrusion 333*a*) and the top layer (the mass layer 333), with the top layer further extending from the free end "F" to the anchor end "A", so that an enlarged thickness T2, an enlarged size and an enlarged mass of the proof mass 330 are all achieved in the present embodiment. The thickness T2 of the proof mass 330 may be about 5-10 times greater than that of the proof mass 130 in the aforementioned first embodiment, for example being about 5-15 μm, preferably being about 10 μm, but not limited thereto. In addition, only the bottom layer (the base layer 331*a* and the protrusion 333*a*) of proof mass 330 is directly disposed on the suspended structure, at the area with less stress distribution (namely, the area closed to the free end "F"), and the top layer (the mass layer 333) of the proof mass 330 is suspended over the anchor end "A" of the suspended structure without directly contacting the stress concentrated area of the suspended structure. Thus, the proof mass 330 with enlarged thickness, size and mass will not cause impacting stiffness to the suspended structure within the suspended region 210, so as to achieve better sensor accuracy. The MEMS device with said proof mass 330 also enables to be applied on TWS earphones, for supplying the voice vibration of microphones.

Figure 8:
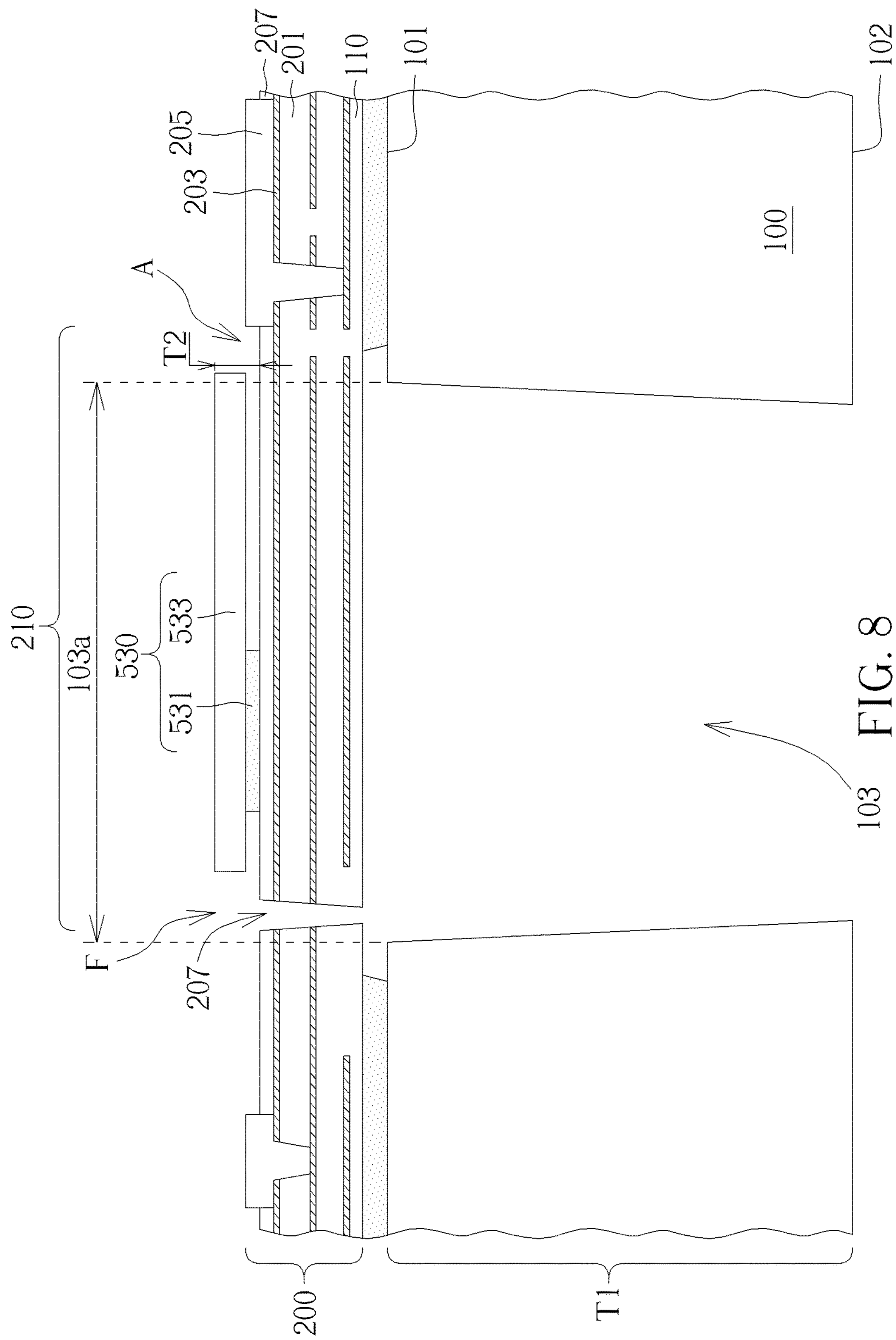
FIG. 8 is another schematic diagram illustrating a cross-sectional view of a MEMS device after forming proof mass.

Please refer to FIG. 8, which illustrate a fabricating process of a MEMS device according to a third embodiment of the present disclosure. The formal steps of the fabricating process in the present embodiment are substantially similar to those in the aforementioned second embodiment, and the similarity between the present embodiment and the aforementioned embodiment will not be redundant described hereinafter. The difference between the present embodiment and the aforementioned embodiment is mainly in that a mass layer 533 of the proof mass 530 only located at the top layer of the double-layer structure without further extending downwardly to surround the base layer 531 located at the bottom layer of the double-layer structure.

Precisely speaking, the mass layer 533 of the present embodiment is directly formed on the base material layer 331 as shown in FIG. 4. Then, similar to the fabricating process of the aforementioned second embodiment, the cavity 103 is formed after forming the protection layer 350, and the oxide layer 110, the protection layer 350 and the base material layer 331 are removed through the isotropic wet etching process. It is noted that, while etching the base material layer of the present embodiment through the isotropic wet etching process, the etching condition such as etching duration and etching rate is further controlled to form the base layer 531 as shown in FIG. 8, with the base layer 531 only remaining at the area with less stress distribution (namely, the area closed to the free end "F") without removing the entire base material layer. In this way, the base layer 531 and the mass layer 333 may also together form a proof mass 530 of the present embodiment, and the proof mass 530 is also disposed adjacent to the free end "F" of the suspended structure within the suspended region 210, without impacting the stiffness to the suspended structure within the suspended region 210.

The MEMS device according to the third embodiment of the present disclosure also includes the suspended structure disposed within the suspended region 210 of the interconnection structure 200, the cavity 103 and the proof mass 530, also to be configured as a MEMS piezoelectric accelerometer device, with the piezoelectric layer within the suspended structure capable of vibrating when applying sound waves or electrical signals, and with the proof mass 530 capable of adjusting the suspended structure to have a resonant frequency that matches the required acoustic frequency range. It is noted that, the proof mass 530 of the present embodiment also includes enlarged size, mass and thickness T2, and the thickness T2 of the proof mass 530 may be about 5-15 μm, but not limited thereto. Also, the proof mass 530 with enlarged thickness, size and mass will not cause impacting stiffness to the suspended structure within the suspended region 210, so as to achieve better sensor accuracy. Thus the MEMS device with said proof mass 530 in the present embodiment also enables to be applied on TWS earphones, for supplying the voice vibration of microphones.

In summary, the present disclosure provides a proof mass with a double-layer structure, with a bottom layer of the proof mass being directly disposed on a suspended structure within a suspended region, located at the area with less stress distribution, and with a top layer of the proof mass being disposed on the bottom layer. In this way, one end of the top layer of the proof mass may be directly disposed on the bottom layer, and another end of the top layer of the proof mass may be further extended and be suspended over the suspended structure within the suspended region without directly contacting the suspended structure within the suspended region. Thus, the size, the mass and the thickness of the proof mass of the present disclosure may be sufficiently enlarged thereby so as to gain improved sensor accuracy. Then, a MEMS device with said proof mass of the present disclose enables to be applied on TWS earphones, for supplying the voice vibration of microphones. People skilled in the arts should easily realize that although a double layered proof mass is exemplified in the aforementioned embodiments of present disclose, the practical structure of the proof mass of the present disclose is not limited thereto. In another embodiment, a multilayered proof mass may also be formed to achieve being partially suspended over the stress concentrated area of the suspended structure within the suspended region, for improving sensor accuracy without causing impacting stiffness to the suspended structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating micro-electromechanical system device comprising:

providing a substrate, the substrate comprising a first surface and a second surface opposite to the first surface;

forming a cavity in the substrate, the cavity extending between the first surface and the second surface;

forming an interconnection structure on the first surface of the substrate, over the cavity, wherein the interconnection structure comprises a suspended region corresponding to the cavity;

forming a penetrating hole in the suspended region, wherein a free end of the interconnection structure is contiguous to the penetrating hole;

forming a proof mass on the interconnection structure in the suspended region, wherein the proof mass is partially suspended over the interconnection structure for adjusting a resonant frequency of the interconnection structure in the suspended region;

forming a base material layer on the interconnection structure before forming the cavity;

forming a mass layer on the base material layer before forming the cavity; and partially removing the base material layer to form a base layer after forming the cavity.

2. The method of fabricating micro-electromechanical system device according to claim 1, wherein the proof mass is formed after forming the cavity.

3. The method of fabricating micro-electromechanical system device according to claim 1, further comprising:

before forming the cavity, forming a hole in the base material layer; and forming the mass layer, wherein the mass layer comprises a protrusion filled in the hole.

4. The method of fabricating micro-electromechanical system device according to claim 3, wherein the protrusion surrounds a sidewall of the base layer and directly contacts the interconnection structure.

5. The method of fabricating micro-electromechanical system device according to claim 1, further comprising:

forming an oxide layer between the interconnection structure and the substrate; and after forming the cavity, partially removing the oxide layer to connect the cavity with the interconnection structure.

6. The method of fabricating micro-electromechanical system device according to claim 1, wherein the forming of the cavity comprises:

partially removing the substrate from the second surface.

7. The method of fabricating micro-electromechanical system device according to claim 1, wherein at least one end of the proof mass is suspended over the interconnection structure.

* * * * *